United States Patent [19]

Nakamura et al.

[11] Patent Number: 4,784,932
[45] Date of Patent: Nov. 15, 1988

[54] IMAGE-FORMING METHOD EMPLOYING LIGHT-SENSITIVE MATERIAL AND IMAGE-RECEIVING MATERIAL

[75] Inventors: Taku Nakamura; Keiji Takeda, both of Minami-ashigara, Japan

[73] Assignee: Fuji Photo Film Co., Ltd., Kanagawa, Japan

[21] Appl. No.: 24,758

[22] Filed: Mar. 11, 1987

[30] Foreign Application Priority Data

Mar. 11, 1986 [JP]  Japan ................................ 61-55503
May 30, 1986 [JP]  Japan ............................... 61-124952
May 30, 1986 [JP]  Japan ............................... 61-124953

[51] Int. Cl.$^4$ ...................... G03C 5/54; G03C 1/68; G03C 5/00
[52] U.S. Cl. .................................. 430/203; 430/207; 430/213; 430/215; 430/254; 430/138; 503/214
[58] Field of Search ............... 430/138, 203, 207, 214, 430/215, 350, 213, 961, 254; 503/207, 214

[56] References Cited

U.S. PATENT DOCUMENTS 4,554,235  11/1985  Adair et al. .......................... 430/138
4,629,676  12/1986  Hayakawa et al. .................. 430/292

OTHER PUBLICATIONS

U.S. application Ser. No. 868,385, filed 5-29-86, Yamamoto et al.

Primary Examiner—Richard L. Schilling
Attorney, Agent, or Firm—Sughrue, Mion, Zinn, Macpeak, and Seas

[57] ABSTRACT

An image-forming method which comprises:
imagewise exposing a light-sensitive material comprising a light-sensitive layer provided on a support wherein the light-sensitive layer contains silver halide, a reducing agent, a polymerizable compound and a color image forming substance;
simultaneously or thereafter developing the light-sensitive material to polymerize the polymerizable compound within the area where the latent image of the silver halide has been formed, and thereby fixing the color image forming substance on the support within the area;
pressing the light-sensitive material on an image-receiving material comprising an image-receiving layer provided on a support wherein the image-receiving layer contains a granulated thermoplastic compound, to transfer the unfixed color image forming substance to the image-receiving material; and
heating the image-receiving material.

10 Claims, 2 Drawing Sheets

IMAGE-FORMING METHOD EMPLOYING LIGHT-SENSITIVE MATERIAL AND IMAGE-RECEIVING MATERIAL

BACKGROUND OF THE INVENTION

1. Field of the Invention

This invention relates to an image-forming method utilizing a light-sensitive material comprising a light-sensitive layer containing silver halide, a reducing agent and a polymerizable compound provided on a support and an image-receiving material.

2. Description of Prior Arts

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143 describe image-forming methods utilizing light-sensitive materials comprising a light-sensitive layer containing silver halide, a reducing agent and a polymerizable compound provided on a support. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed.

The above-mentioned image forming methods are based on the principle in which the polymerizable compound is polymerized in the portion where a latent image of the silver halide has been formed.

Japanese Patent Provisional Publication No. 61(1986)-260241 (corresponding to U.S. patent Ser. No. 854,640) describes another image forming method in which the polymerizable compound in a portion where a latent image of the silver halide has not been formed is polymerized. In this method, when the material is heated, the reducing agent functions as polymerization inhibitor in the portion where a latent image of the silver halide has been formed, and the polymerizable compound in the other portion is polymerized.

Further, Japanese Patent Provisional Publication No. 61(1986)-73145 (corresponding to U.S. Pat. No. 4,629,676 and European Patent Provisional Publication No. 0174634A2) describes an image-forming method which comprises: imagewise exposing a light-sensitive material comprising a light-sensitive layer provided on a support wherein the light-sensitive layer contains silver halide, a reducing agent, a polymerizable compound and a color image forming substance; simultaneously or thereafter developing the light-sensitive material; and pressing the light-sensitive material on an image-receiving material to transfer the unfixed color image forming substance to the image-receiving material. According to the embodiment of the methods, a clear color image can be formed on the image-receiving material. It is noted, however, that when a smooth-faced material is employed as the image-receivng material to obtain a glossy image, it is difficult to obtain a transferred image having a high maximum density, because the color image forming substance is not sufficiently transferred to the image-receiving material.

SUMMARY OF THE INVENTION

An object of the present invention is to provide an image-forming method which gives a glossy transferred image having high maximum density.

Another object of the invention is to provide an image-forming method which gives an image having an excellent preservability.

A further object of the invention is to provide an image-receiving material which gives a clear transparent image and which is preferably employable in the image-forming method.

There is provided by the present invention an image-forming method which comprises:

imagewise exposing a light-sensitive material comprising a light-sensitive layer provided on a support wherein the light-sensitive layer contains silver halide, a reducing agent, a polymerizable compound and a color image forming substance;

simultaneously or thereafter developing the light-sensitive material to polymerize the polymerizable compound within the area where the latent image of the silver halide has been formed (or the area where the latent image of the silver halide has not been formed), and thereby fixing the color image forming substance on the support within the area;

pressing the light-sensitive material on an image-receiving material comprising an image-receiving layer provided on a support wherein the image-receiving layer contains a granulated thermoplastic compound, to transfer the unfixed color image forming substance to the image-receiving material; and heating the image-receiving material.

The image-forming method of the invention is characterized in employing an image-receiving material comprising an image-receiving layer provided on a support wherein the image-receiving layer contains a granulated thermoplastic compound, and in heating the image-receiving material to which the unfixed color image forming substance has been transferred.

In the image-forming method of the invention, the unfixed color image forming substance is transferred to the image-receiving layer which contains a granulated thermoplastic compound. The surface of the image-receiving layer has an adequate roughness with the grains of the thermoplastic compound, and thereby the transferred image has high maximum density. Further, the image-receiving material to which the unfixed color image forming substance was transferred is heated to form a smooth film of the thermoplastic compound. Therefore, a clear glossy image can be obtained.

To the image-receiving material, the unpolymerized polymerizable compound is also transferred with the unfixed color image forming substance. The diffusion of the unpolymerized polymerizable compound in a liquid state or a non-solid state causes the blurring of the obtained image. In the image-forming method of the invention, the image-receiving material is heated to polymerize the unpolymerized polymerizable compound, and thereby the sharpness of the image is maintained. Further, the image formed on the image-receiving material is protected by the above film. Therefore, the image-forming method of the invention gives an image having excellent preservability. Further, it is easy to handle the image-receiving material after the image formation, because the obtained image is well fixed in the image-receiving material.

Japanese Patent Provisional Publication No. 60(1985)-259490 (corresponding to U.S. Pat. No. 4,554,235) describes a transfer imaging system employing a developer sheet which comprises a support, a developer layer and a discontinuous layer of a thermoplastic polymeric pigment in this order. In this system, a photo-polymerization initiator or a photo-depolymerization initiator is used as a photo-sensor. The present invention provide a different image-forming method in which silver halide is used as a photo-sensor to improve the sensitivity.

The present invention further provides an image-receiving material which comprises an image-receiving layer provided on a support wherein the image-receiving layer contains a thermoplastic compound in the form of grains (or particles) and a developer intervening in a space between the grains of the thermoplastic compound. This image-receiving material can be advantageously used in the image-forming method in which a color former is employed as the color image forming substance.

The image-receiving material of the invention is characterized in the image-receiving layer which contains a developer in a space formed by grains of the thermoplastic compound.

In the image-receiving material of the invention, the image-receiving layer consists of a single layer. Thus, the surface of the support is directly covered with the uniform film of the thermoplastic compound containing the developed color former, when the image-receiving material, to which the unfixed color former (color image forming substance) has been transferred, is heated. Therefore, the obtained image has an excellent glossiness, because the image receiving layer is transparent totally, as compared to the image-receiving material in which two or more layers are provided on the support as described in Japanese Patent Provisional Publication No. 60(1985)-259490 (U.S. Pat. No. 4,554,235).

In the case that the support of the image-receiving material of the invention is made of a transparent material, a clear transparent image can be formed, because the image receiving layer is totally transparent for the above reason.

Further, the transferred color former is sufficiently in contact with the developer, because the developer is contained homogeneously throughout the image-receiving layer which is arranged as the outer layer of the image-receiving material, and the transferred color former is smoothly dispersed in the image-receiving layer by the grains of the thermoplastic compound. Therefore, the transferred image on the image-receiving material of the invention has more high maximum density.

Furthermore, the developed color former is sealed in the film of the thermoplastic compound, when the image-receiving material, to which the unfixed color former has been transferred, is heated. Thus, the image formed on the image-receiving material is completely protected by the film. Therefore, the image-receiving material of the invention gives an image having a more excellent preservability.

DETAILED DESCRIPTION OF THE INVENTION

The image-forming method of the present invention employs an image-receiving material having an image-receiving layer which contains a granulated thermoplastic compound.

There is no specific limitation with respect to the thermoplastic compound, and any known thermoplastic compound including a thermoplastic resin and a wax can be employed in the invention. The thermoplastic compound preferably has a melting point of from 30° C. to 200° C., more preferably 50° C. to 150° C.

Examples of the thermoplastic resin include polyethylene (preferably amorphous), polypropylene (preferably amorphous), styrene/butadiene copolymer, styrene/methyl methacrylate copolymer, polyvinyl acetate, vinyl acetate/vinyl chloride copolymer, vinylidene chloride/vinyl chloride copolymer, vinylidene chloride/acrylonitrile copolymer, polyvinyl butyral, polyvinyl formal, vinyl acetate/ethylene copolymer, polystyrene, styrene/acrylonitrile copolymer, polyvinyl chloride, polyvinylidene chloride, polymethyl methacrylate, methyl methacrylate/methacrylate copolymer, ethyl acrylate/acrylic acid copolymer, polyethyl acrylate, polybutyl acrylate, polybutyl methacrylate, styrene/acrylate copolymer, polymethyl acrylate, 2-ethylhexyl acrylate/methacrylate copolymer.

Examples of the wax include beeswax, castor wax, stearic acid, glycerol monostearate, stearamide, stearyl alcohol, palmitic acid, a hardened oil and a hardened fat.

The image-receiving layer contains grains of the above thermoplastic compound. The grains of the thermoplastic compound preferably have a means size of from 0.05 μm to 100 μm, more preferably 0.1 μm to 50 μm.

The amount of the thermoplastic compound in the image-receiving layer preferably ranges from 0.1 mg/m$^2$ to 20 g/m$^2$, more preferably ranges from 0.5 g/m$^2$ to 10 mg/m$^2$.

The image-receiving material which comprises the image-receiving layer containing the above granulated thermoplastic compound provided on a support is described hereinbelow. The image-forming method employing the image-receiving material or the image-receiving layer is described in Japanese Patent Provisional Publication No. 61(1986)-278849.

The image-receiving material can be prepared according to the color formation system of the image-forming method. For example, when a color formation system using a color former and a developer is employed, the developer can be contained in the image-receiving layer or another layer of the image-receiving material. When a dye or a pigment is employed as the color image forming substance, there is no need of incorporating a developer into the iamge-receiving layer. Therefore, the image-receiving materials employable in the image-forming method of the invention are classified into the following three embodiments.

In the first embodiment of the image-receiving material, a color developing layer containing the developer and an image-receiving layer containing the granulated thermoplastic compound are provided on a support in this order. In the second embodiment, an image-receiving layer containing the granulated thermoplastic compound and a developer contained in a space formed by the grains of the thermoplastic compound is provided on a support. In the third embodiment, an image-receiving layer containing the granulated thermoplastic compound and containing no developer is provided on a support.

The first and second embodiments are employed in a system in which the color image forming substance is a color former. The third embodiment is employed in a system in which the color image forming substance is a dye or a pigment. Among these three embodiments, the second embodiment is most preferred.

In the image-receiving material of the invention, the developer contained in a space formed by the grains of the thermoplastic compound. There is no specific limitation with respect to the position of the developer. For example, the developer can be adsorbed on the surface of the grain of the thermoplastic compound. Alternatively, the space between the grains can be filled with a binder containing the developer.

In the image-receiving material of the invention, the amount of the developer in the image-receiving layer preferably ranges from 0.01 g to 10 g based on 1 g of the thermoplastic compound, more preferably ranges from 0.1 g to 1 g.

Details of the color formation system and the developer will be hereinafter given in descriptions with respect to the color image forming substance employed in the light-sensitive material.

The image-receiving layer can further contain optional components other than the thermoplastic compound and the developer. Examples of the optional components of the image-receiving layer include a binder, a dye, a pigment, a thermal polymerization initiator and a mordant.

The image-receiving layer preferably contains a polymer as a binder, so long as the grains of the thermoplastic compound are not adhesive. Binders employable in the image-receiving layer preferably are transparent or semi-transparent hydrophilic binders. Examples of the binders include natural substances such as gelatin, gelatin derivatives, cellulose derivatives (e.g., carboxymethylcellulose, methylcellulose), starch, and gum arabic; and synthetic polymeric substances, such as water-soluble polyvinyl compounds (e.g., polyvinylalcohol, polyvinylpyrrolidone, and acrylamide polymers). These binders can be used singly or in combination.

The amount of the binder in the image-receiving layer preferably ranges from 0.001 g to 1 g based on 1 g of the thermoplastic compound, more preferably ranges from 0.01 g to 0.1 g.

A dye or a pigment can be contained in the image-receiving layer for the purposes of placing a character, a symbol or a frame in the image-receiving layer prior to the image formation, coloring the background of the image, and making it easy to distinguish the sides of the image-receiving material. There is no specific limitation on the dye and the pigment, and those which will be hereinafter given in descriptions with respect to the color image forming substance are employed as the above dye and pigment. In the case that the dye or pigment possibly disturbs the image formed on the image-receiving layer, it is preferred to make density of the dye or the pigment lower (e.g., reflection density of not higher than 1), or to employ a dye or a pigment which can be discolored by heating or irradiation with light.

Further, when a white pigment, such as titanium dioxide or barium sulfate, is contained in the image-receiving layer, the image-receiving layer can function as a white reflection layer. In this case, the white pigment is used in amount of from 10 g to 100 g based on 1 g of the thermoplastic compound.

These dyes and pigments may be either uniformly or partially contained in the image-receiving layer. For example, when the support is composed of a transparent material, the white pigment can be partially contained in the image-receiving layer to make a part of the reflection image transparent. Thus, information of the image which is unnecessary in the transparent image may be placed in the part of the image-receiving layer containing the white pigment as the reflection image.

In the case that a dye or a pigment is employed as the color image forming substance, the image-receiving layer can contain a mordant. The mordant can be selected from the compounds known in the art of the conventional photography according to the kind of the dye or the pigment.

The thickness of the image-receiving layer preferably ranges from 0.5 to 100 μm, more preferably from 1 to 50 μm.

In the first embodiment of the image-receiving material, a color developing layer containing the developer is arranged between the image-receiving layer and the support.

The color developing layer can further contain the other optional components, such as the binder, the thermal polymerization initiator, the mordant those of which are the same as in the image-receiving layer.

The amount of the binder in the color developing layer preferably ranges from 0.001 g/m$^2$ to 100 g/m$^2$, more preferably ranges from 0.1 g/m$^2$ to 10 g/m$^2$.

The thickness of the color developing layer preferably ranges from 1 to 100 μm, more preferably from 1 to 20 μm.

Examples of the material employable as the support of the image-receiving material include glass, paper, fine paper, coat paper, cast-coat paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

In order to obtain a transparent image, the support should be made of a transparent material. In this case, the transmittance of the support preferably is not less than 30%, more preferably is not less than 50%.

The image-receiving material can be prepared, for instance, by the following process.

The image-receiving material is usually prepared by dissolving, emulsifying or dispersing each of the components of the image-receiving layer in an adequate medium to obtain coating solution, and then coating the obtained coating solution on a support. For example, the coating solution can be prepared as a latex in which the thermoplastic resin is dispersed in a medium to obtain the image-receiving layer containing the granulated thermoplastic resin. Alternatively, the coating solution can be prepared as a dispersion of the grains of a wax.

The image-forming method employing the above image-receiving material is described below.

Figure 1:
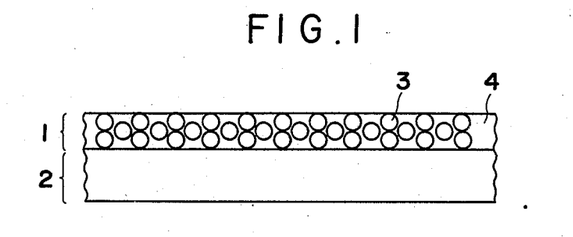
FIG. 1 is a sectional view schematically illustrating an embodiment of the image-receiving material of the invention.

FIG. 1 is a sectional view schematically illustrating an embodiment of the image-receiving material of the invention (the second embodiment of the image-receiving material). In FIG. 1, the image-receiving material comprises an image-receiving layer 1 provided on a support 2. The image-receiving layer 1 comprises grains of the thermoplastic compound 3 and a binder containing a developer 3 which is contained in a space formed by the grains of the thermoplastic compound.

Figure 2:
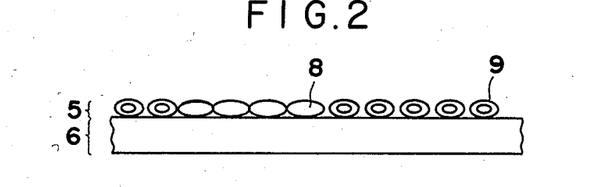
FIG. 2 is a sectional view schematically illustrating an embodiment of the light-sensitive material employable in the image-forming method of the invention.

FIG. 2 is a sectional view schematically illustrating an embodiment (which employs microcapsules) of the light-sensitive material employable in the image-forming method of the invention. In FIG. 2, the light-sensitive material comprises a light-sensitive layer 5 provided on a support 6. The light-sensitive layer 5 comprises microcapsules 8, 9 which contain silver halide, a reducing agent, a polymerizable compound and a color former (color image forming substance). The microcapsule 9 is that in which the polymerizable compound has been polymerized after an exposure and a development process. The microcapsule 8 is that in which the polymerizable compound has not been polymerized.

Figure 3:
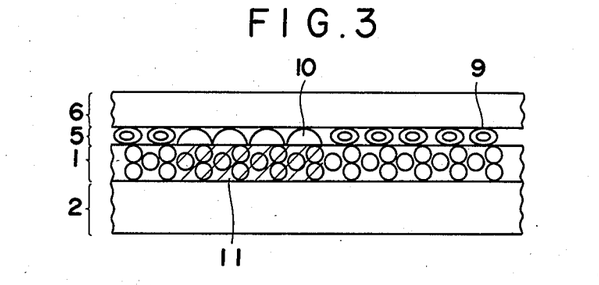
FIG. 3 is a sectional view schematically illustrating a stage for transferring the color image forming substance to the image-receiving material.

FIG. 3 is a sectional view schematically illustrating the transference of the color image forming substance to the image-receiving material. As shown in FIG. 3, the light-sensitive layer 5 of the light-sensitive material shown in FIG. 2 is pressed on the image-receiving layer 1 of the image-receiving material shown in FIG. 1. Thus, the microcapsule (8 in FIG. 2) in which the polymerizable compound has not been polymerized is destroyed (10), and thereby the color former is imagewise transferred to the image-receiving layer (11).

Figure 4:
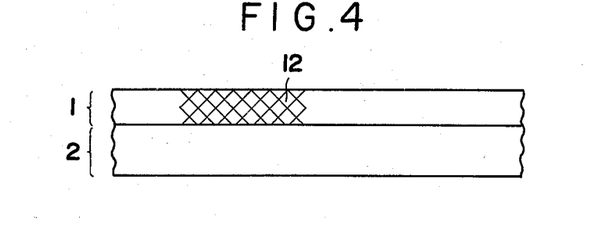
FIG. 4 is a sectional view schematically illustrating an image-receiving material which has been heated after the image formation.

FIG. 4 is a sectional view schematically illustrating the image-receiving material which has been heated after the image formation. As shown in FIG. 4, in the image-receiving layer 1, the grains of the thermoplastic compound has melted and united to form a uniform, transparent and glossy film including an area 12 in which the transferred color former has been developed.

As described hereinbefore, an image-forming method of the invention comprises:

imagewise exposing a light-sensitive material comprising a light-sensitive layer provided on a support wherein the light-sensitive layer contains silver halide, a reducing agent, a polymerizable compound and a color image forming substance;

simultaneously or thereafter developing the light-sensitive material to polymerize the polymerizable compound within the area where the latent image of the silver halide has been formed (or the area where the latent image of the silver halide has not been formed), and thereby fixing the color image forming substance on the support within the area;

pressing the light-sensitive material on an image-receiving material comprising an image-receiving layer provided on a support wherein the image-receiving layer contains a granulated thermoplastic compound, to transfer the unfixed color image forming substance to the image-receiving material; and heating the image-receiving material.

There is no specific limitation with respect to a heating means for the image-receiving material. The image-receiving material can be heated under pressure (e.g., a method employing the following heat roller).

The image-receiving material can be directly contacted with a hot plate or drum to heat the material. The material can be passed through a heat roller. Further, a high frequency, a laser beam and an eddy current caused by electromagnetic induction can be employed as the heating mean. The image-receiving material can be heated in a heating bath using air or a liquid which is inert to the material (e.g., fluorine-containing liquid).

Furthermore, a heat source can be previously provided in the image-receiving material. For example, a layer comprising conductive particles, such as carbon black or graphite, can be provided in the material, and the material can be heated by Joule' heat in the above layer when the electricity is applied.

In the case that the component forming the image is susceptible to air oxidation upon heating, the air surrounding the image-receiving layer can be degassed or replaced with an inert gas. The image-receiving layer can be heated under a cover to prevent the volatile compornents from evaporation or to keep the thermal energy.

The temperature for heating preferably ranges from 50° C. to 200° C., more preferably ranges from 60° C. to 150° C., and most preferably ranges from 80° C. to 120° C. The period for heating preferably ranges from 1 second to 5 minutes, more preferably ranges from 15 seconds to 1 minute. In the case that the image-receiving material is heated under pressure, the pressure preferably is not more than 1,000 kg/cm$^2$, more preferably not more than 500 kg/cm$^2$.

The imagewise exposure of the light-sensitive material, the development process and the transference of the unfixed color image forming substance to the image-receiving material in the image-forming method of the invention are described below.

Various exposure means can be employed in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either a monochromatic image or a color image.

Development of the light-sensitive material can be conducted simultaneously with or after the imagewise exposure. The development can be conducted using a developing solution in the same manner as the image-forming method described in Japanese Patent Publication No. 45(1970)-11149. The image-forming method which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material. The temperature for heating in the development process usually ranges from 80° C. to 200° C., and preferably from 100° C. to 160° C. Various heating patterns are applicable. The heating time is usually from 1 second to 5 minutes, and preferably from 5 seconds to 1 minute.

During the above development process, a polymerizable compound within the area where a latent image of the silver halide has been formed or within the area where a latent image of the silver halide has not been formed is polymerized. In a general system, the polymerizable compound present within the area where the latent image has been formed is polymerized. If the nature or amount of the reducing agent is controlled, the polymerizable compound within the area where the latent image has not been formed can be polymerized.

At the above-mentioned stage, the color image forming substance within the area where the latent image has been formed (or the area where the latent image of the silver halide has not been formed) is fixed by the polymerization.

After the development process, the light-sensitive material is pressed on the image-receiving material to transfer the unfixed color image forming substance to the image-receiving material. The process for pressing can be carried out in various known manners.

The image-forming method can be used for monochromatic or color photography, printing, radiography, diagnosis (e.g., CRT photography of diagnostic device using supersonic wave), copy (e.g., computer-graphic hard copy), etc.

The light-sensitive material which can be used for the imge-forming method of the invention are described below. The light-sensitive material used in the invention comprises a light-sensitive layer containing silver halide, a reducing agent, a polymerizable compound and a color image forming substance provided on a support. Thus composed material is referred hereinafter to as "light-sensitive material".

There is no specific limitation with respect to silver halide contained in the light-sensitive layer of the light-sensitive material.

Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed.

There is no specific limitation on the crystal habit of silver halide grains. Two or more kinds of silver halide grains which differ in halogen composition, crystal habit, grain size, and/or other features from each other can be used in combination. There is no specific limitation on grain size distribution of silver halide grains. The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either an area where a latent image of the silver halide has been formed on an area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The reducing agents are described in T. James, "The Theory of the Photographic Process", 4th edition, 291-334 (1977), Research Disclosure No. 17029, 9-15 (June 1978), and Research Disclosure No. 17643, 22-31 (December 1978). The reducing agents described in the these publications and applications can be employed in the light-sensitive material of the present invention. Thus, "the reducing agent(s)" in the present specification means to include all of the reducing agents described in the above mentioned publications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine and 1-trityl-2-[{2-(N-ethyl-N-octylsulfamoyl)-4-methanesulfonyl}-phenyl]hydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications and applications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5° to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substances include both colored substance (i.e., dyes and pigments) and non-colored or almost non-colored substances (i.e., color former or dye- or pigment-precursor) which develops to give a color under application of external energy (e.g., heating, pressing, light irradiation, etc.) or by contact with other components (i.e., developer).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), 29-58 (pressure-sensitive copying paper), 87-95 (azo-graphy), 118-120 (heat-sensitive color formation by a chemical change) or in MSS. of the seminar promoted by the Society of Kinki Chemical Industry, "The Newest Chemistry of Coloring Matter—Attractive Application and New Development as a Functional Coloring Matter", 26-32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

The light-sensitive material can be prepared by arranging a light-sensitive layer containing the above-mentioned components on a support. There is no limitation with respect to the support. In the case that heat development is utilized in the use of the light-sensitive material, the material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene).

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent, the color image forming substances may be also contained in the oil droplets.

There is also no specific limitation on shell material of the microcapsule, and various known materials such as polymers which are employed in the conventional microcapsules can be employed as the shell material. The mean size of the microcapsule preferably ranges from 0.5 to 50 μm, more preferably 1 to 25 μm, most preferably 3 to 20 μm.

The light-sensitive layer can further contain optional components such as sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers and binders.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide.

The sensitizing dye is preferably added during the stage of the preparation of the silver halide emulsion.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, hot-melt solvents, and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The hot-melt solvent is preferably used in an amount of from 0.5 to 50% by weight, and more preferably from 1 to 20% by weight, based on the total solid content of the light-sensitive layer.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound located in a portion where the latent image has not been formed is polymerized, the thermal polymerization initiators are preferably incorporated into the light-sensitive layer.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or alumina described in U.S. Pat. No. 2,711,375. Such particles preferably have a mean size of 3 to 50 μm, more preferably 5 to 40 μm. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination.

Examples and usage of the other optional components which can be contained in the light-sensitive layer are also described in the above-mentioned publications and applications concerning the light-sensitive material, and in Research Disclosure Vol. 170, No. 17029, 9-15 (June 1978).

Examples of auxiliary layers which are optionally arranged on the light-sensitive material include an image-receiving layer, a heating layer, an antistatic layer, an anticurl layer and a release layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving layer.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid compositions containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the organic silver salts are introduced in the light-sensitive microcapsule, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide, including the silver halide emulsion), the reducing agent, or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamineformaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive material can be prepared by coating and drying the above-prepared coating solution on a support in the conventional manner.

The present invention is further described by the following examples without limiting the invention.

EXAMPLE 1

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% aqueous slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on an art paper having basis weight of 43 g/m$^2$ to give a layer having wet thickness of 30 μm.

To 120 g of 25% latex of polystyrene (thermoplastic compound (a)) were added 200 ml of 5% aqueous solution of sodium dodecylbenzenesulfonic acid and 100 ml of 5% aqueous solution of polyvinyl alcohol, and the resulting mixture was made uniform. The mixture was then further coated on the above art paper using a coating rod of #30 to give a layer having a wet thickness of 53 μm and dried at room temperature to obtain an image-receiving material (A).

EXAMPLE 2

Preparation of image-receiving material

Each of image-receiving materials (B) to (D) was prepared in the same manner as in the Example 1 except that each of the following latexes of thermoplastic compounds (b) to (d) was used in place of 120 g of 25% latex of polystyrene.

(b) 150 g of 20% latex of polyvinyl acetate.
(c) 150 g of 20% latex of polybutyl methacrylate
(d) 160 g of 18% latex of methyl methacrylate/methacrylic acid copolymer

Preparation of silver halide emulsion

In 3 l of water were dissolved 40 g of gelatin and 23.8 g of potassium bromide and the resulting gelatin solution was kept at 50° C. To the gelatin solution, 200 ml of an aqueous solution containing 32.3 g of silver nitrate was added over a period of 10 minutes while stirring. To the solution, 100 ml of an aqueous solution containing 1.66 g of potassium iodide was added over a period of 2 minutes to obtain a silver bromoiodide emulsion. After the emulsion was adjusted to a pH for sedimentation, excess salts were removed, and the emulsion was adjusted to a pH of 6.0. The yield of the emulsion was 400 g.

Preparation of light-sensitive composition

In 100 g of pentaerythritol tetraacrylate were dissolved 0.40 g of the following copolymer and 6.00 g of Pargascript Red I-6-B (tradename, Ciba-Geigy).

(Copolymer)

To 18.0 g of the resulting solution were added 0.26 g of the following reducing agent (I), 1.22 g of the following reducing agent (II), 0.20 g of 1% ethyl acetate solution of the following antifogging agent and 0.36 g of Emulex NP-8 (tradename, produced by Nippon Emulsion Co., Ltd.). To the mixture was further added 1.20 g of methylene chrolide, and the resulting mixture was made uniform.

Further, to the resulting solution was added 4.06 of the silver halide emulsion. The resulting mixture was stirred at 18,000 r.p.m. for 3 min. using a homogenizer to obtain a light-sensitive composition.

Preparation of light-sensitive microcapsule

To 10.51 g of 18.6% aqueous solution of Isobam (tradename, produced by Kuraray Co., Ltd.) was added 48.56 g of 2.89% aqueous solution of pectin. After the solution was adjusted to a pH of 4.0 using 10% solution of sulfuric acid, the light-sensitive composition was added to the resulting solution, and the mixture was stirred at 7,000 r.p.m. for 2 min. using a homogenizer to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde, and 3.00 g of 8.00% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 10% aqueous solution of Emulex NP-8 (tradename, produced by Nippon Emulsion Co., Ltd.) and 1.86 g of 10% aqueous solution of 1,4-diazabicyclo[2,2,2]octane to prepare a coating solution. The coating solution was uniformly coated on a polyethyleneterehthalate film (thickness: 100 μm) using a coating rod of #3 to give a layer having a wet thickness of 56 μm and air-dried at room temperature to obtain a light-sensitive material.

Image-formation on image-receiving material

The light-sensitive material was imagewise exposed to light using a tungsten lamp at 2,000 lux for 1 second through a filter in which the density contimuously varied from 0 to 2.0, and then heated on a hot plate at 125° C. for 20 seconds. The exposed and heated light-sensitive material was then combined with each of the image-receiving materials prepared in Examples 1 and 2, and passed through press rolls under pressure of 300 kg/cm². Then, each of the image-receiving materials was heated on a hot plate at 140° C. for 10 seconds to obtain a magenta positive image on each of the image-receiving materials. The density of the obtained image was measured using Macbeth reflection desitometer.

The results are set forth in Table 1.

TABLE 1

| Image-receiving Material | Latex of Thermoplastic Compound | Density of Transferred Image | |
|---|---|---|---|
| | | Maximum Density | Minimum Density |
| (A) | (a) | 1.32 | 0.11 |
| (B) | (b) | 1.26 | 0.07 |
| (C) | (c) | 1.45 | 0.10 |
| (D) | (d) | 1.46 | 0.12 |

It is apparent from the result in Table 1 that a clear image having high contrast is formed on each of the image-receiving materials. Further each of the images was a glossy image.

EXAMPLE 3

Preparation of image-receiving material

On an art paper having basis weight of 43 g/m² was coated the following coating solution, and dried to give an image-receiving layer having dry thickness of about 15 μm to to obtain an image-receiving material (E).

| Composition of coating solution | |
|---|---|
| Polyethylene powder (avarage grain size: about 10 μm) | 6 g |
| Zinc salicylate | 4 g |
| 2 weight % aqueous solution of polyvinyl alcohol (avarage degree of polymerization: about 500) | 18 g |
| Ethanol | 6 g |

Preparation of light-sensitive composition

The following mixture was made uniform to obtain an oil phase.

| Composition of oil phase | |
|---|---|
| Trimethylolpropane triacrylate | 20 g |
| 3-Dimethylamino-6-methyl-7-anilinofluoran | 1 g |
| Azobisisobutyronitrile | 1.2 g |
| 10 weight % acetone solution of ethylcellulose | 4 g |

To the oil phase was added the following silver halide mixture, and the resulting mixture was stirred at room temperature for 10 minutes to emulsify the silver halide emulsion.

| Composition of silver halide mixture | |
|---|---|
| Silver chlorobromide emulsion containing 10 weight % silver chlorobromide (molar ratio: chlorine/bromine = 1/1) and 7 weight % gelatin | 6.0 g |
| 5 weight % aqueous solution of sodium p-dodecylbenzenesulfonate | 0.6 g |

The mixture was further stirred for evapolating the acetone to obtain a light-sensitive composition containing microcapsules having a core material comprising a silver halide emulsion.

Preparation of double layer shell microcapsule

The whole amount of the light-sensitive composition was added to the following aqueous medium, and the mixture was stirred for 10 minutes at 40° C. to emulsify the light-sensitive composition in the aqueous medium.

| Composition of aqueous medium | |
| --- | --- |
| 10 weight % aqueous solution of gelatin | 20 g |
| 2 weight % aqueous solution of carboxymethyl cellulose | 40 g |
| 5 weight % aqueous solution of sodium p-dodecylbenzenesulfonate | 1 g |

To the emulsion were dropwise added 10 g of 20 weight % aqueous solution of sodium sulfate anhydride over a period of 10 minutes, 30 g of 2 weight % aqueous solution of carboxymethylcellulose and another 10 g of 20 weight % aqueous solution of sodium sulfate anhydride over a period of 10 minutes in this order to form gelatin shell of the outer microcapsule. To the mixture was added 30 g of water, and the mixture was cooled to 5° C. for 10 minutes. Further, to the mixture was added 5 g of 3 weight % aqueous solution of dimethylolurea, and the mixture was made uniform. The resulting mixture was allowed to stand at room temperature for 24 hours to obtain a dispersion of microcapsules having a double layer shell.

Preparation of light-sensitive material

On a polyethyleneterephthalate film was coated the following coating solution and dried to give a light-sensitive layer having thickness of about 10 μm to obtain the light-sensitive material.

| Composition of coating solution | |
| --- | --- |
| Dispersion of double layer shell microcapsules | 8.0 g |
| Sorbitol | 0.3 g |
| 1 weight % methanol solution of 4-methyl-4'-hydroxymethyl-1-phenyl-3-pyrazolidone | 0.8 g |
| 2 weight % methanol solution of benzotriazole | 0.3 g |
| 10 weight % methanol solution of triethanolamine | 0.5 g |

Image-formation on image-receiving material

The light-sensitive material was imagewise exposed to light using a halogen lamp at 2,000 lux for 1 second through a manuscript, and then heated on a hot plate at 125° C. for 40 seconds. The exposed and heated light-sensitive material was then combined with the image-receiving material (E), and passed through press rolls under pressure of 350 kg/cm² to obtain a black positive image on the image-receiving material. The reflection of light from the surface of the image-receiving layer was scattered.

Then, the image-receiving material was heated on a hot plate at 125° C. for 30 seconds. Thus, the image-receiving layer was made a uniform polymer film, and a clear glossy image was obtained.

EXAMPLE 4

Preparation of light-sensitive microcapsule

To 25 g of 10 weight % aqueous solution of gum arabic was added 27 g of the following solution while stirring.

| Composition of solution for water phase | |
| --- | --- |
| Isobutylene/maleic anhydride copolymer | 5.0 g |
| Sodium hydoxide | 2.0 g |
| Water | 30.0 g |

To the mixture was added 40 g of water, and the resulting mixture was heated to 60° C. After the mixture was adjusted to pH 4.0 using 10% solution of sulfuric acid, to the mixture were added 6.6 g of urea and 0.8 g of resorcinol. Then the mixture was further adjusted to pH 4.0 to obtain an aqueous phase.

To the following solution A was added the following mixture B, and the resulting mixture was stirred at about 10,000 r.p.m. for 10 min. using a homogenizer at 30° C. to emulsify the mixture B in the solution A. Thus, an oil phase (W/O emulsion) was obtained.

| Composition of solution A | |
| --- | --- |
| Pentaerythritol tetraacrylate | 50 g |
| 3-Dimethylamino-6-methyl-7-anilinofluoran | 3 g |
| Azobisisobutyronitrile | 3 g |
| Methylene chloride | 50 g |

| Composition of mixture B | |
| --- | --- |
| Silver chlorobromide emulsion containing 10 weight % silver chlorobromide (molar ratio: chlorine/bromine = 1/1) and 7 weight % geratin | 20 g |
| 5 weight % aqueous solution of formaldehyde | 2 g |
| Benzotriazole | 2 g |

The whole amount of the oil phase was added to the whole amount of the water phase, and the mixture was stirred to obtain a W/O/W double emulsion. The resulting emulsion was heated to 60° C., and to the emulsion was added 20 g of 37 vol. % aqueous solution of formaldehyde while stirring. The mixture was further stirred for 2 hours.

To the resulting mixture was added 13 g of 5 weight % aqueous solution of ammonium sulfate. After the mixture was adjusted to pH 9.0 using aqueous solution of sodium hydroxide, 3 g of sodium bisulfite was added to the mixture to obtain an aqueous slurry of the light-sensitive microcapsules. The mean size of the microcapsule was about 5 μm.

Preparation of light-sensitive material

On a paper was coated the following coating solution which has been finely stirred to give a layer having a wet thickness of about 20 μm, and dried to obtain a light-sensitive material.

| Composition of coating solution | |
| --- | --- |
| Slurry of the light-sensitive microcapsule | 10 g |
| 10 weight % aqueous solution of polyvinyl alcohol (avarage degree of polymerization: about 500) | 5 g |

| Composition of coating solution | |
| --- | --- |
| Sorbitol | 0.3 g |
| Triethanolamine | 0.3 g |
| Solution of 0.3 g of 4-methyl-1-phenyl-3-pyrazolidone in 3 g of methanol | 3 g |

Image-formation on image-receiving material

The light-sensitive material was imagewise exposed to light using a halogen lamp at 50 lux for 2 seconds through a monochromatic step wedge (step of the optical density: 0.3), and then heated on a hot plate at 125° C. for 8 seconds. The exposed and heated light-sensitive material was then combined with the image-receiving material (E) used in Example 3, and passed through press rolls under pressure of 350 kg/cm² to obtain a black negative image which has 6 steps corresponding to the exposure on the image-receiving material. The reflection of light from the surface of the image-receiving layer was scattered.

Then, the image-receiving material was heated on a hot plate at 125° C. for 30 seconds. Thus, the image-receiving layer was made a uniform polymer film, and a clear glossy image was obtained.

EXAMPLE 5

Preparation of image-receiving material

On a polyethyleneterephthalate film having a thickness of 100 μm was coated the coating solution used in preparation of image-receiving material in Example 3, and dryed to give an image-receiving layer having dry thickness of about 15 μm to to obtain an image-receiving material (F).

Image-formation on image-receiving material

The image was formed on the image-receiving material (F) in the same manner as in Example 3, except that the image-receiving matarial (F) was used. Thus, a black positive image was obtained. The reflection of light from the surface of the image-receiving layer was scattered.

Then, the image-receiving material was heated on a hot plate at 125° C. for 30 seconds. Thus, the image-receiving layer was made a uniform and transparent polymer film, and a clear transparent image was obtained.

Further, when the image-receiving material was projected by OHP (over head projector), a clear image was obtained on a screen.

EXAMPLE 6

Image-formation on image-receiving material

A pressure-sensitive paper, KAN BAN 40W (tradename, produced by Fuji Photo Film Co., Ltd.) was combined with the light-sensitive material prepared in Example 5, as the layer of the pressure-sensitive paper, on which microcapsules containing a color former had been coated, faced the image-receiving layer. Then, from the back of the pressure-sensitive paper (the opposite side of the layer containing the microcapsules), an image (character) was written by typewriter and in handwriting. Thus a black positive image was obtained on the image-receiving material. The reflection of light from the surface of the image-receiving layer was scattered.

Then, the image-receiving material was heated on a hot plate at 125° C. for 30 seconds. Thus, the image-receiving layer was made a uniform and transparent polymer film, and a clear transparent image was obtained.

Further, when the image-receiving material was projected by OHP, a clear image was obtained on a screen.

EXAMPLE 7

Preparation of image-receiving material

Figure 5:
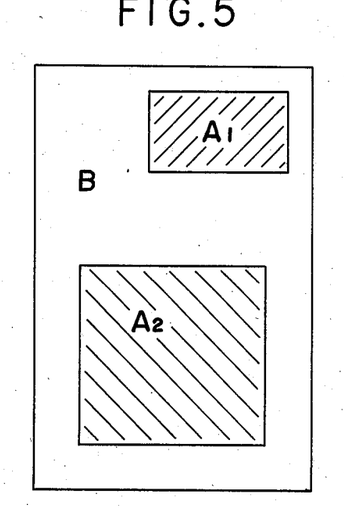
FIG. 5 is a plane view schematically illustrating areas where each of the coating solutions of the image-receiving layer is coated.

FIG. 5 is a plane view illustrating the areas where each of the coating solutions of the image-receiving layer is coated.

On the area A1 as shown in FIG. 5 of a polyethyleneterephthalate film having thickness of 100 μm was coated a coating solution, in which 0.1 g of Rose Bengale (red dye) was added to the coating solution used in the preparation of image-receiving material in Example 3, and dried to give a layer having dry thickness of about 15 μm. On the area A2 was coated a coating solution, in which 0.1 g of Acridine Yellow (yellow dye) was added to the coating solution used in Example 3, and dried in a similar manner as above. Further, on the area B was coated a coating solution, in which 3 g of titanium dioxide powder was added to the coating solution used in Example 3, and dried in a similar manner as above. Thus, the image-receiving (G) was obtained.

Image-formation on image-receiving material

Figure 6:
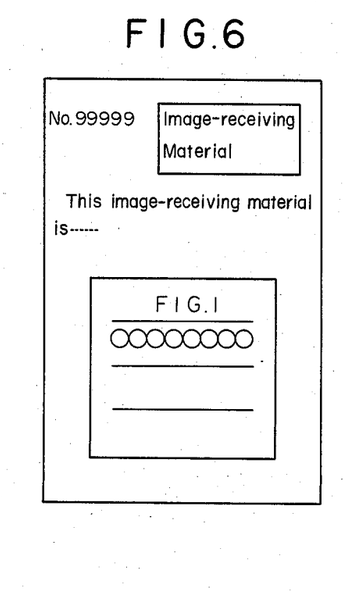
FIG. 6 is a plane view schematically illustrating an image formed on the image-receiving material and viewed as a reflected image.

The image was formed on the image-receiving material (G) in the same manner as in Example 6, except that the image-receiving matarial (G) was used. Thus, a black positive image was obtained on each of the areas A1, A2 and B. Further, a literal information was written on the area B by a ball-point pen in handwriting. Thus, the reflected image as shown in FIG. 6. was obtained.

Then, the image-receiving material was heated on a hot plate at 125° C. for 30 seconds. Thus, the image-receiving layer was made a uniform polymer film. There was no change in the reflected image as shown in FIG. 6. However, on a red background in the area A1 and on an yellow background in the area A2, a transparent image was obtained.

Figure 7:
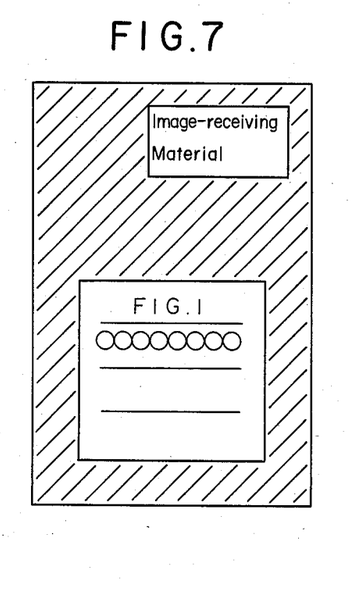
FIG. 7 is a plane view illustrating an image formed on the image-receiving material and viewed as a transmitted image.

Further, when the image-receiving material was projected by OHP, a projected image as shown in FIG. 7 was obtained on a screen. As shown in FIG. 7, a clear image was obtained on the areas A1 and A2, and no image was obtained on the area B. Therefore, information of the image which was unnecessary in the projected image could be formed on the reflection image.

Furthermore, when the hues of the areas A1 and A2 were determined according to the kind of the image imformation, these areas could be used for the index classifying the image-receiving material.

EXAMPLE 8

Preparation of light-sensitive composition

The following mixture was made uniform to obtain an oil phase.

| Composition of oil phase | |
| --- | --- |
| Trimethylolpropane triacrylate | 20 g |
| Phthalocyanine (metal free) | 1 g |
| 1,1'-Azobis(1-cyclohexane carbonitrile) | 1 g |
| 10 weight % acetone solution of | 4 g |

-continued

| Composition of oil phase | |
|---|---|
| ethylcellulose | |

To the oil phase was added the silver halide mixture used in Example 3, and the resulting mixture was stirred at room temperature in the dark for 10 minutes into emulsify the silver halide emulsion.

The mixture was further stirred for evapolating the acetone to obtain a light-sensitive composition containing microcapsules having a core material comprising a silver halide emulsion and a shell material comprising ethylcellulose.

Preparation of double layer shell microcapsule

A dispersion of the double layer shell microcapsules was prepared in the same manner as in Example 3, except that the above light-sensitive composition was used.

Preparation of light-sensitive material

A light-sensitive material was prepared in the same manner as in Example 3, except that the above dispersion of double layer shell microcapsule was used and that the obtained light-sensitive layer had dry thickness of about 7 μm.

Preparation of image-receiving material

On an art paper having basis weight of 43 g/m² was coated the following coating solution, and dryed to give an image-receiving layer having a dry thickness of about 15 μm to to obtain an image-receiving material (H).

| Composition of coating solution | |
|---|---|
| Polyethylene powder (avarage grain size: about 10 μm) | 6 g |
| 2 weight % aqueous solution of polyvinyl alcohol (avarage degree of polymerization: about 500) | 18 g |

Image-formation on image-receiving material

The image was formed on the image-receiving material (H) in the same manner as in Example 3, except that the above light-sensitive material and the image-receiving matarial (H) were used. Thus, a blue positive image was obtained. The reflection of light from the surface of the image-receiving layer was scattered.

Then, the image-receiving material was heated on a hot plate at 125° C. for 40 seconds. Thus, the image-receiving layer was made a uniform polymer film, and a clear glossy image was obtained.

EXAMPLE 9

Preparation of image-receiving material

The image-receiving material (I) was prepared in the same manner as in Example 7, except that the coating solution used in the preparation of image-receiving material in Example 8 was used in place of the coating solution used in Example 3.

Image-formation on image-receiving material

The image was formed on the image-receiving material (G) in the same manner as in Example 8, except that the image-receiving matarial (I) was used. Thus, a blue positive image was obtained on each of the areas A1, A2 and B. Further, a literal information was written on the area B by a ball-point pen in handwriting.

The reflected image on the image receiving layer and the projected image on a screen were similar to those in Example 7, as shown in FIGS. 6 and 7.

We claim:

1. An image-forming method which comprises;
   imagewise exposing a light-sensitive material comprising a light-sensitive layer provided on a support wherein the light-sensitive layer containing silver halide, a reducing agent, a polymerizable compound containing carbon to carbon unsaturation and a color image forming substance;
   simultaneously or thereafter developing the light-sensitive material to polymerize the polymerizable compound within the area where the latent image of the silver halide has been formed, and thereby fixing the color image forming substance on the support within the area;
   pressing the light-sensitive material on an image-receiving material comprising an image-receiving layer provided on a support wherein the image-receiving layer contains a granulated thermoplastic compound, to transfer the unfixed color image forming substance to the image-receiving material, wherein the color image forming substance is a color former and the image-receiving layer of said image-receiving material further contains a developer in a space formed by the grains of the thermoplastic compound, and
   heating the image-receiving material.

2. The image-forming method as claimed in claim 1, wherein the temperature for heating the image-receiving material is in the range of from 50° C. to 200° C.

3. The image-forming method as claimed in claim 1, wherein the development is done by a heat development process.

4. The image-forming method as claimed in claim 1, wherein the development is done by a heat development process and the temperature for the heat development process is in the range of from 80° C. to 200° C.

5. The image-forming method as claimed in claim 1, wherein the thermoplastic compound is contained in the image-receiving layer of the image-receiving material in an amount of from 0.1 g/m² to 20 g/m².

6. An image-forming method which comprises:
   imagewise exposing a light-sensitive material comprising a light-sensitive layer provided on a support wherein the light-sensitive layer contains silver halide, a reducing agent, a polymerizable compound containing carbon to carbon unsaturation and a color image forming substance, wherein the color image forming substance is a color former and the image-receiving layer of said image-receiving material further contains a developer in a space formed by the grains of the thermoplastic compound;
   simultaneously or thereafter developing the light-sensitive material to polymerize the polymerizable compound within the area where the latent image of the silver halide has not been formed, and thereby fixing the color image forming substance within the area;
   pressing the light-sensitive material on a image-receiving material comprising an image-receiving layer provided on a support wherein the image-receiving layer contains a granulated thermoplastic compound, to transfer the unfixed color image forming substance to the image-receiving material, wherein the color image forming substance is a color former and the image-receiving layer of said image-receiving material further contains a developer in a space formed by the grains of the thermoplastic compound; and heating the image-receiving material.

7. The image-forming method as claimed in claim 6, wherein the temperature for heating the image-receiving material is in the range of from 50° C. to 200° C.

8. The image-forming method as claimed in claim 6, wherein the development is done by a heat development process.

9. The image-forming method as claimed in claim 6, wherein the develpment is done by a heat development process and the temperature for the heat development process is in the range of from 80° C. to 200° C.

10. The image-forming method as claimed in claim 6, wherein the thermoplastic compound is contained in the image-receiving layer of the image-receiving material in an amount of from 0.1 $g/m^2$ to 20 $g/m^2$.

* * * * *